US008417504B2

(12) United States Patent
Veller et al.

(10) Patent No.: US 8,417,504 B2
(45) Date of Patent: Apr. 9, 2013

(54) CONVERSION OF CIRCUIT DESCRIPTION TO A TRANSACTION MODEL

(75) Inventors: Yossi Veller, Herzliya (IL); Vasile Hanga, Netanya (IL); Alexander Rozenman, Rishon Lezion (IL); Rami Rachamim, Tel Aviv (IL)

(73) Assignee: Mentor Graphics Corporation, Wilsonville, OR (US)

( * ) Notice: Subject to any disclaimer, the term of this patent is extended or adjusted under 35 U.S.C. 154(b) by 282 days.

(21) Appl. No.: 11/811,695

(22) Filed: Jun. 11, 2007

(65) Prior Publication Data

US 2007/0276644 A1 Nov. 29, 2007

Related U.S. Application Data

(63) Continuation of application No. PCT/IL2006/001348, filed on Nov. 23, 2006.

(60) Provisional application No. 60/748,957, filed on Dec. 8, 2005.

(51) Int. Cl.
*G06F 17/50* (2006.01)

(52) U.S. Cl. ........... 703/14; 703/13; 703/15; 703/16; 703/17; 709/203; 709/224; 709/248; 710/105; 710/100; 710/110

(58) Field of Classification Search ........... 703/14, 703/17, 18, 13, 15, 16; 716/4; 709/13, 14, 709/15, 16, 17; 710/105, 100, 110
See application file for complete search history.

(56) References Cited

U.S. PATENT DOCUMENTS

| 5,602,753 A | 2/1997 | Fukui |
| 5,752,002 A * | 5/1998 | Naidu et al. ............... 703/14 |

(Continued)

FOREIGN PATENT DOCUMENTS

| WO | WO02/08966 | 1/2002 |
| WO | WO 03098491 A1 | 11/2003 |

(Continued)

OTHER PUBLICATIONS

A. Cavalli, M. Tabourier Passive testing and application to the GSM-MAP protocol Information and Software Technology 41, pp. 813-821, Elsevier Science B.V., 1999.*

(Continued)

*Primary Examiner* — Saif Alhija
*Assistant Examiner* — Cuong Luu
(74) *Attorney, Agent, or Firm* — Klarquist Sparkman, LLP

(57) ABSTRACT

A system and method are described for converting a circuit description into transaction-based description at a higher level of abstraction. Thus, a designer can readily view a series of transactions that occurred in the simulation of a circuit. In one aspect, the simulated signals are analyzed and converted into messages of a protocol used by the design. A combination of the messages represents a transaction. Thus, the simulated signals are then converted into a series of protocol transactions. In another aspect, a message recognition module performs the analysis of the simulated signals and converts the simulated signals into messages (e.g., request for bus, bus acknowledge, etc.). A transaction recognition module analyzes the messages and converts the messages into transactions (e.g., Read, Write, etc.). Using both the system and method the circuit description is converted into a higher level of abstraction that allows more comprehensive system-level analysis.

17 Claims, 9 Drawing Sheets

U.S. PATENT DOCUMENTS

| | | | |
|---|---|---|---|
| 6,263,301 B1 * | 7/2001 | Cox et al. | 703/14 |
| 6,845,341 B2 | 1/2005 | Beverly et al. | |
| 6,910,025 B2 | 6/2005 | Cao | |
| 7,136,947 B1 * | 11/2006 | Passerone et al. | 710/100 |
| 7,290,056 B1 * | 10/2007 | McLaughlin, Jr. | 709/230 |
| 7,490,030 B2 | 2/2009 | Burton et al. | |
| 7,512,732 B1 * | 3/2009 | Goossens | 710/315 |
| 2002/0004927 A1 | 1/2002 | Takahashi et al. | |
| 2002/0078423 A1 | 6/2002 | Alden et al. | |
| 2003/0097348 A1 | 5/2003 | Cao | |
| 2003/0226124 A1 * | 12/2003 | Marschner et al. | 716/4 |
| 2004/0063434 A1 | 4/2004 | Hamalainen et al. | |
| 2004/0088151 A1 | 5/2004 | Burton et al. | |
| 2005/0131666 A1 * | 6/2005 | Tsai et al. | 703/17 |
| 2005/0132306 A1 | 6/2005 | Smith et al. | |
| 2005/0192787 A1 * | 9/2005 | Kuwahara et al. | 703/18 |
| 2005/0197982 A1 | 9/2005 | Saidi et al. | |
| 2005/0257178 A1 | 11/2005 | Daems et al. | |
| 2007/0168893 A1 | 7/2007 | Watanabe et al. | |
| 2008/0120082 A1 | 5/2008 | Alexanian et al. | |

FOREIGN PATENT DOCUMENTS

| | | |
|---|---|---|
| WO | PCT/IL2006/001348 | 3/2007 |
| WO | PCT/IL2006/001349 | 4/2007 |
| WO | PCT/IL2006/001350 | 4/2007 |

OTHER PUBLICATIONS

Anna Cavalli, Caroline Gervy, Svetlana Prokopenko New Approaches for passive testing using an Extended Finite State Machine specification Information and Software Technology 45, pp. 837-852, 2003.*

Maria Domenica Di Bennetto, Alberto Sangiovanni-Vincentelli, Tiziano Villa Model Matching for Finite-State Machines IEEE Transaction on Automatic Control, vol. 46, No. 11, Nov. 2001.*

Written Opinion and International Search Report for PCT/IL2006/001348, filed Nov. 23, 2006.

International Search Report of PCT/IL2006/001348, mailed Mar. 27, 2007, 2 pages.

International Search Report of PCT/IL2006/001349, mailed Apr. 24, 2007, 2 pages.

International Search Report of PCT/IL2006/001350, mailed Apr. 17, 2007, 2 pages.

U.S. Appl. No. 11/811,685, filed Jun. 11, 2007, Yossi Veller et al.

U.S. Appl. No. 11/811,680, filed Jun. 11, 2007, Yossi Veller et al.

Nam Sung Kim, et al., "Microarchitectural Power Modeling Techniques for Deep Sub-Micron Microprocessors," Proceedings of the 2004 International Symposium on Low Power Electronics and Design. ISLPED 2004, Aug. 9, 2004, pp. 211-217.

Bernstein, A., et al, "How to bridge the abstraction gap in system level modeling and design," Computer Aided Design, 2004. ICCAD-2004, Nov. 7, 2004, pp. 910-914.

Jindal, R. et al, "Verification of transaction-level system models using RTL testbenches," Formal Methods and Models for Co-Design, 2003. MEMOCODE '03 Proceedings, Jun. 24, 2003, pp. 200-202.

Caldari et al., "Instruction Based Power Consumption Estimation Methodology," IEEE 2002, pp. 721-724.

Dhanwada et al., "A Power Estimation Methodology for SystemC Transaction Level Models," CODES+ISSS'05, Sep. 19-21, 2005, IEEE, pp. 142-147.

Givargis et al., "Trace-driven System-level Power Evaluation of System-on-a-chip Peripheral Cores," IEEE 2001, pp. 302-311.

* cited by examiner

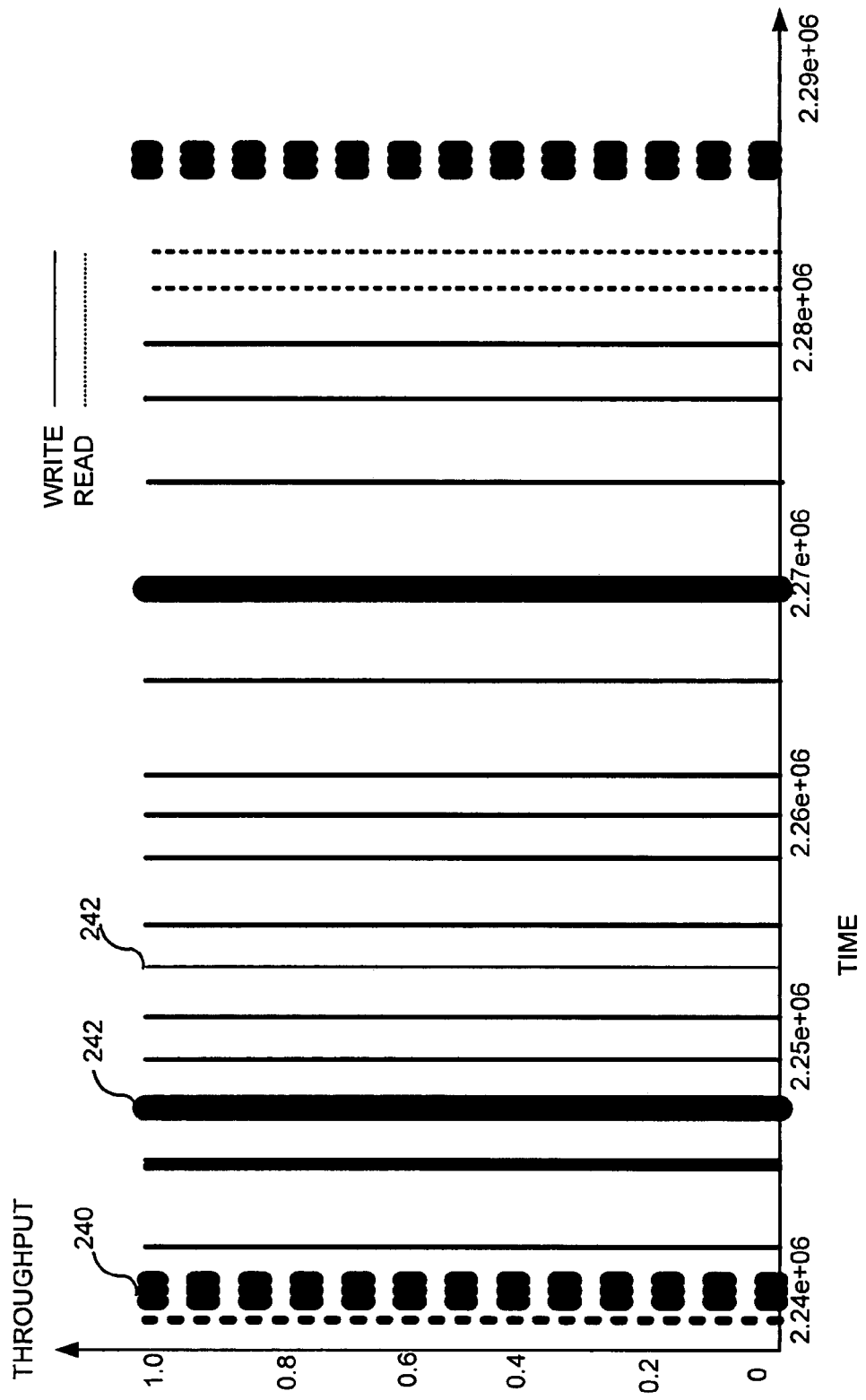

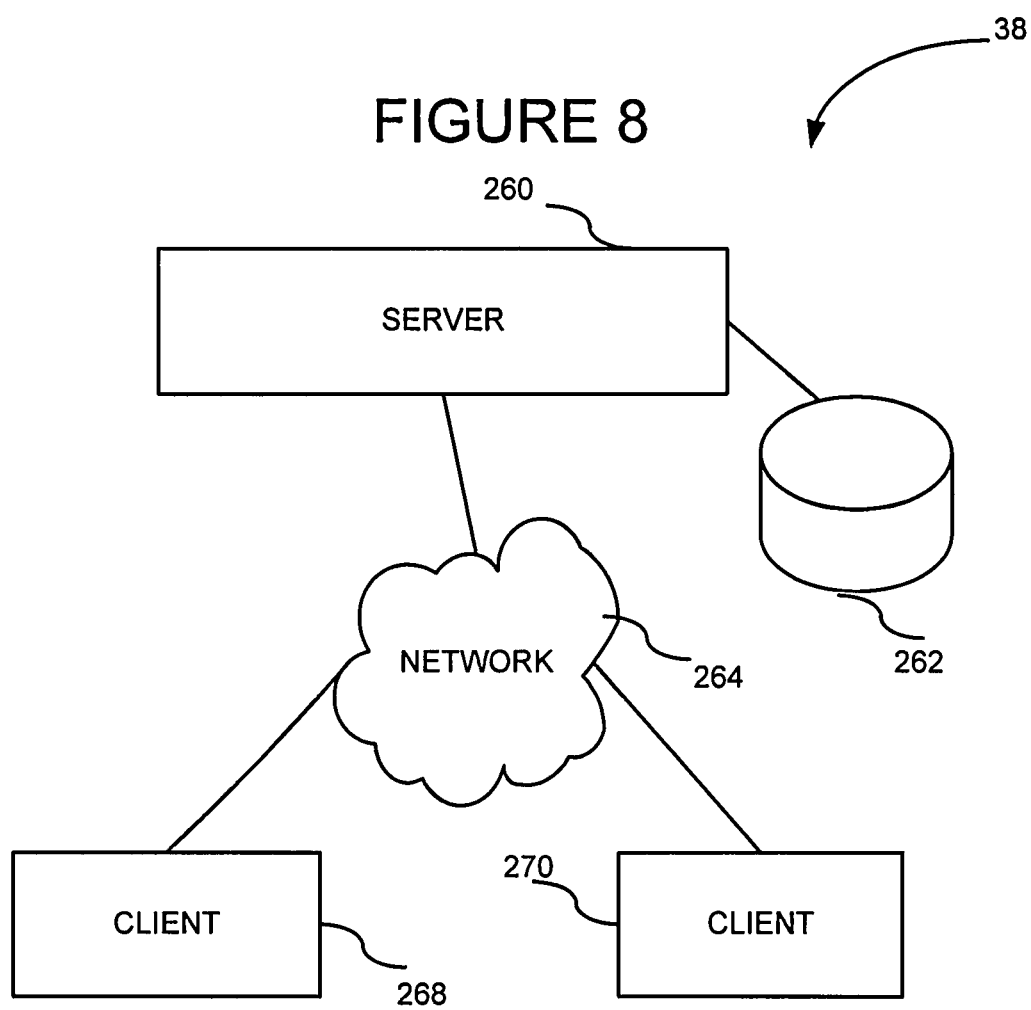

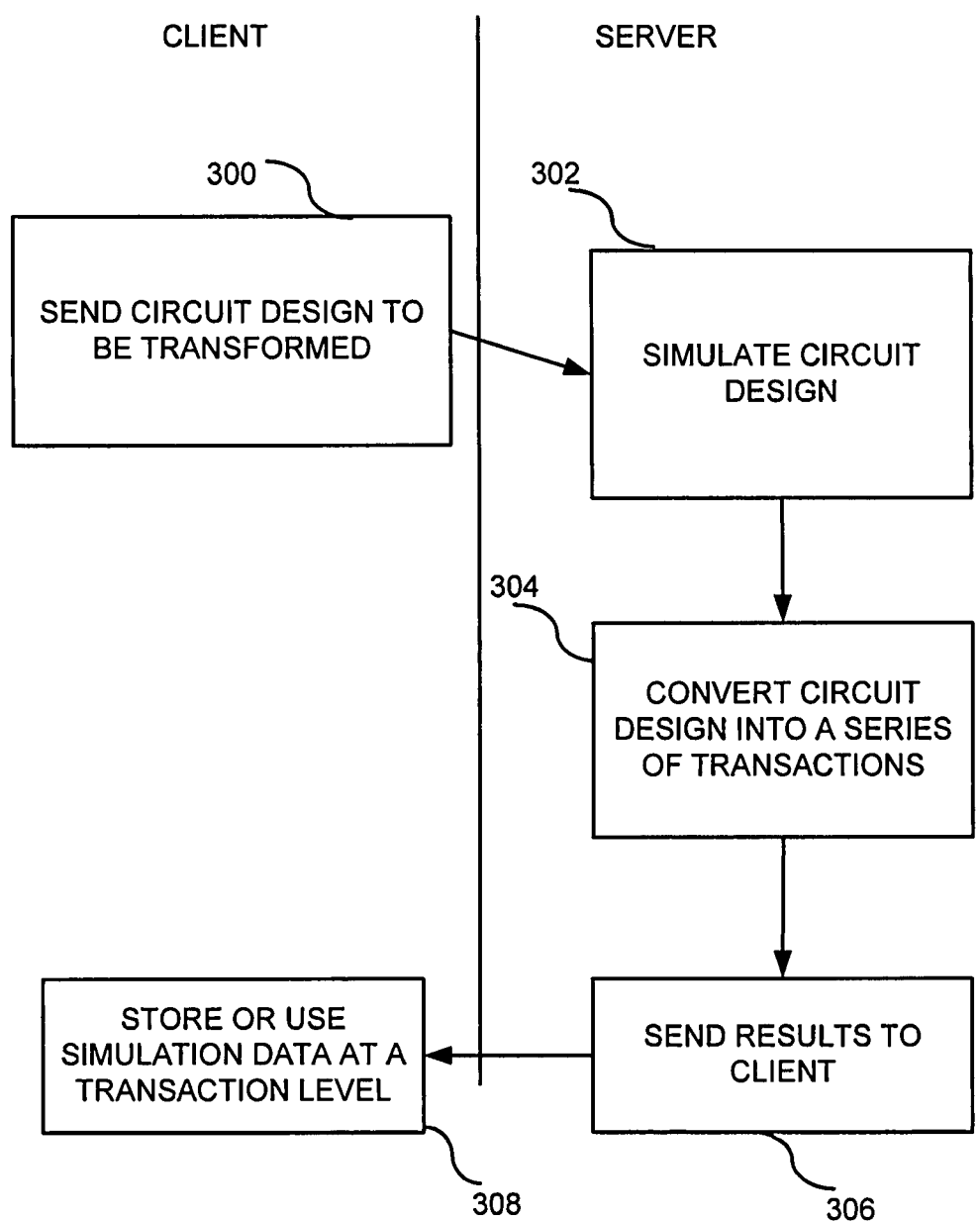

US 8,417,504 B2

CONVERSION OF CIRCUIT DESCRIPTION TO A TRANSACTION MODEL

RELATED APPLICATION DATA

This application is a continuation of co-pending International Patent Application No. PCT/IL2006/001348, filed on Nov. 23, 2006, which claims the benefit of U.S. Provisional Patent Application No. 60/748,957, filed Dec. 8, 2005, both of which are hereby incorporated by reference.

FIELD OF THE INVENTION

The present invention generally relates to simulation, and more particularly to converting a simulated circuit description to a higher level of abstraction.

BACKGROUND

The complexity of integrated circuits (ICs) being designed nowadays is continuously increasing and has resulted in complete system-on-chip (SoC) solutions. Even more, the complexity of such integrated systems is exploding thanks to advances in process fabrication. The limiting factor is now the ability to design, manage and verify such systems rather than the ability to fabricate them.

The typical design process begins with a software program that describes the behavior or functionality of a circuit. This software program is written in a hardware description language (HDL) that defines a behavior to be performed with limited implementation details. Logic synthesis tools convert the HDL program into a gate netlist description. The RTL description is used to verify functionality and ultimately generate a netlist that includes a list of components in the circuit and the interconnections between the components. This netlist is used to create the physical integrated circuit.

As SoC's are becoming larger, the only way to efficiently design such dense SoC's, both from the design complexity and time-to-market aspects, is by embedding Intellectual Property (IP) cores. Standards for such cores are currently evolving. Ideally, they should be reusable, pre-characterized and pre-verified. But it often desirable to change the design to create the next generation. For example, as fabrication technology changes, it is desirable to convert or migrate the design to the new process parameters. For example, an IP core may be designed and tested for 90 nm technology, but it is desirable to convert the IP core to a new process of 60 nm technology. Or it may be desirable to update the design and incorporate changes in order to create the next generation design.

In order to test and explore such changes in the design, simulation must be performed, which is very time consuming. A few seconds of real-time simulation can take weeks or even months. If the simulation results are not desirable, then the design process must start over again by changing the high-level code and re-simulating.

Once the simulation is performed, it is necessary to interpret the simulation results. However, the simulation results are often represented and displayed as multiple hardware lines (signals) having pulses thereon at various moments in time. Such a view is difficult to interpret because of the volume of information.

SUMMARY

A system and method are disclosed for converting simulation data of a circuit description, such as in HDL, into transactions of a protocol. Thus, a designer can readily view a series of transactions that occurred in the simulation of a circuit. By viewing the data at a higher level of abstraction, the designer can better understand the system flow and bottlenecks.

In one aspect, the simulated signals are analyzed and converted into messages of a protocol used by the design. A combination of the messages represent a transaction. Thus, the simulated signals may be then converted into a series of protocol transactions.

In another aspect, a message recognition module performs the analysis of the simulated signals and converts the simulated signals into messages (e.g., request for bus, bus acknowledge, etc.). A transaction recognition module analyzes the messages and converts the messages into transactions (e.g., Read, Write, etc.).

These features and others of the described embodiments will be more readily apparent from the following detailed description, which proceeds with reference to the accompanying drawings.

BRIEF DESCRIPTION OF THE DRAWINGS

FIG. 7 shows a transaction-based view of the simulation data that may be displayed to the user.

FIG. 8 shows a network that may be used to implement the invention.

FIG. 9 is a flowchart of a method for implementing the invention over the network of FIG. 8.

DETAILED DESCRIPTION

Figure 1:
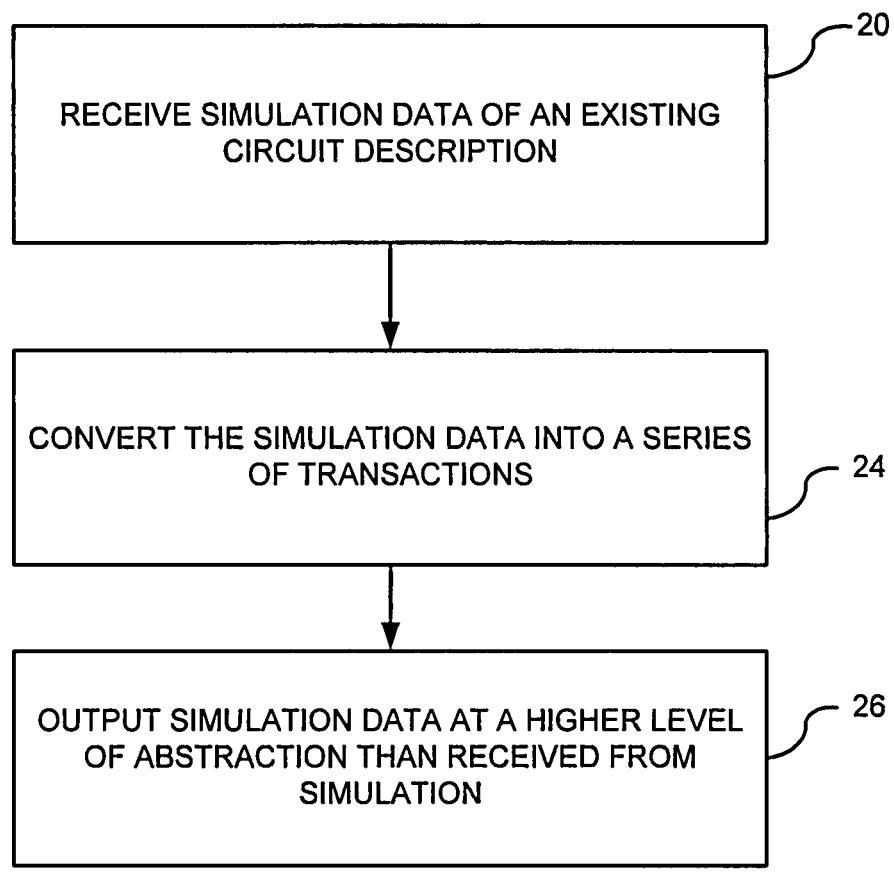
FIG. 1 is a flowchart of a method for converting simulation data of a circuit into a series of transactions.
Figure 3:
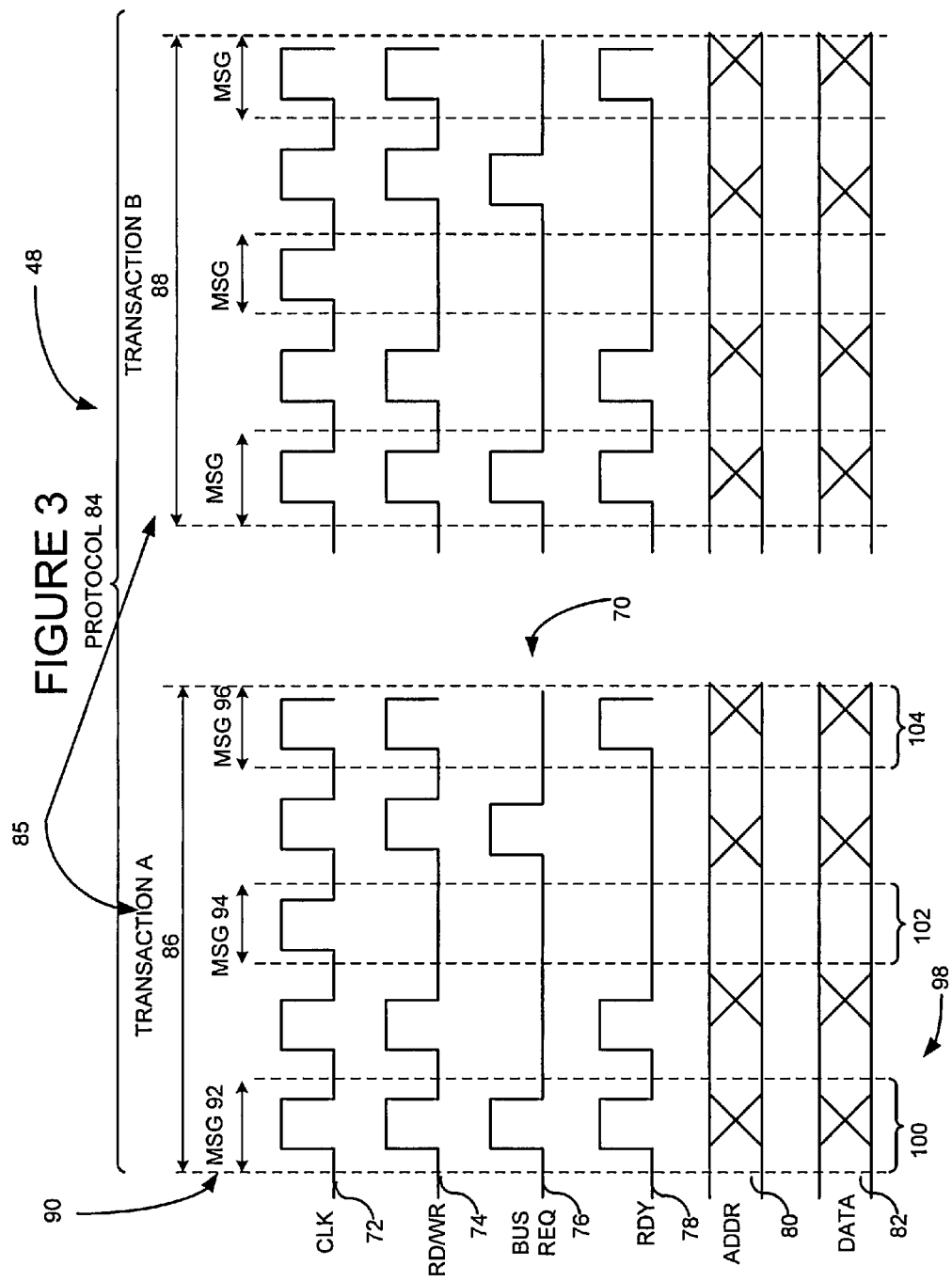
FIG. 3 is a detailed example showing simulated signal data of the circuit description on numerous hardware lines.

FIG. 1 shows a flowchart of a method for converting simulation data of a circuit description to a transaction-based description, which is at a higher layer of abstraction. In process box 20, simulation data of a circuit description is received. The circuit description may be in HDL or any other software language and it may be compiled and simulated as part of a single design flow or it may be separately compiled and simulated. Thus, the simulation can be run in combination with the conversion process to a transaction-based description, or it can be run on a separate machine at a separate time. Any desired simulator may be used, such as ModelSim®, available from Mentor Graphics Corporation. In process box 24, the simulation data of the circuit is converted into a series of transactions associated with a predetermined protocol. The protocol used is typically provided as input into the system by the user. In process box 26, the simulation data is output in the form of the transactions, which is a higher level of abstraction than the received simulated circuit design. For example, FIG. 3 shows a simulated circuit description, which is at a signal level including a plurality of signals on various hardware lines. FIG. 7 illustrates the converted circuit description at a transaction level. The output may be achieved by a variety of techniques, such as displayed to the user on a display (not shown), output to a file, etc.

Figure 2:
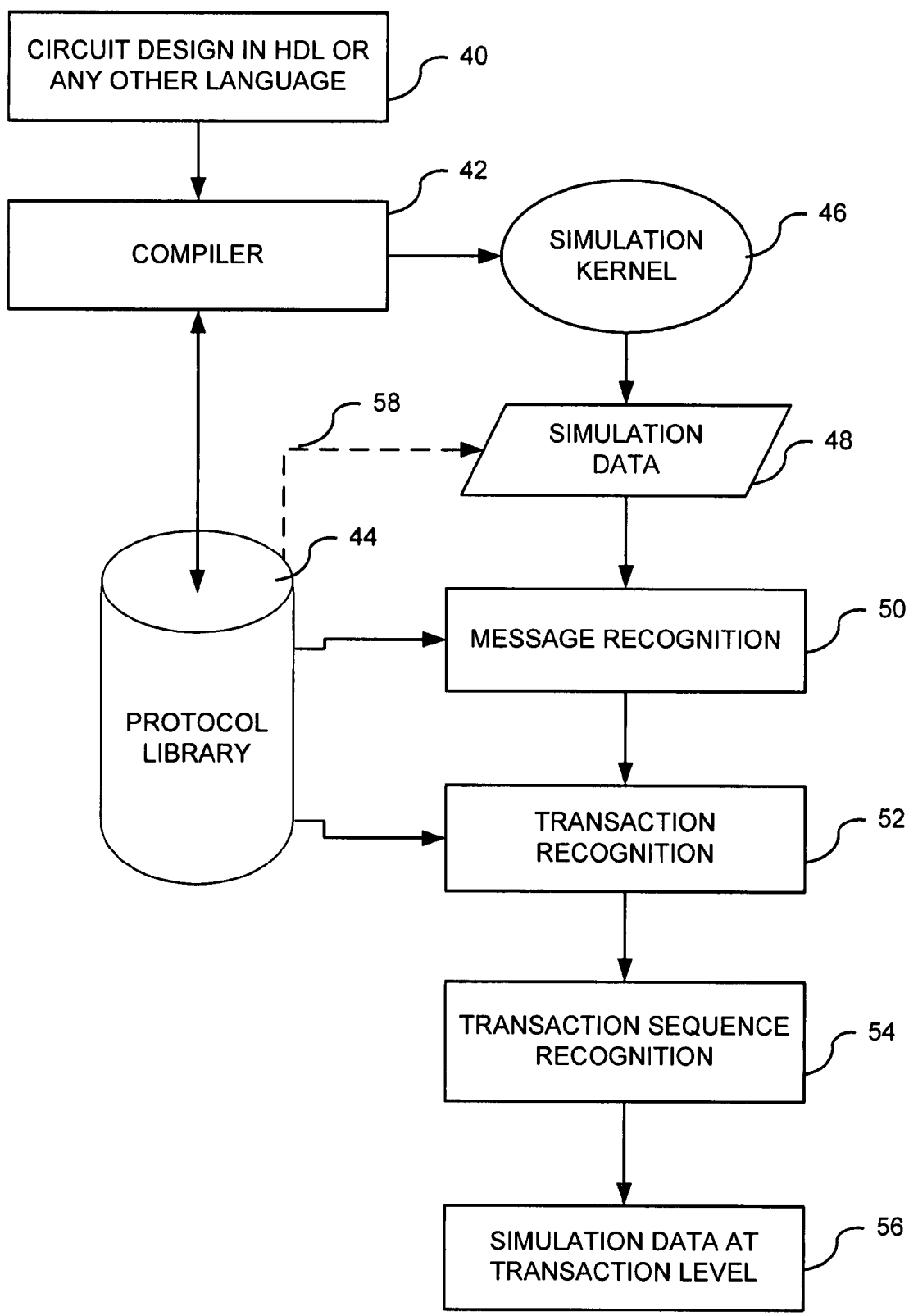
FIG. 2 is a hardware diagram of a system used to convert the simulation data of a circuit into transactions.

FIG. 2 shows a hardware diagram of a system 38 for converting a circuit description into a circuit description at the transaction level. A storage device 40 of any desired type has stored thereon the circuit design in HDL or any other desired language that may be used to describe circuits. A compiler 42 compiles the design and a protocol library 44. The compiler 42 may be any desired compiler and is usually included as part of a simulator package. The protocol library 44 includes messages and transactions associated with a protocol used by the circuit. Messages include part of a transaction, such as a request and an acknowledge of the bus, whereas a transaction is a complete operation, such as any of a variety of types of Read or Write transactions. A simulation kernel 46 simulates the compiled design in a well-known manner, as already described. The simulation kernel 46 outputs the simulation data 48 in any desired format. Box 48 can also represent pre-simulated design data (VCD format).

Figure 4:
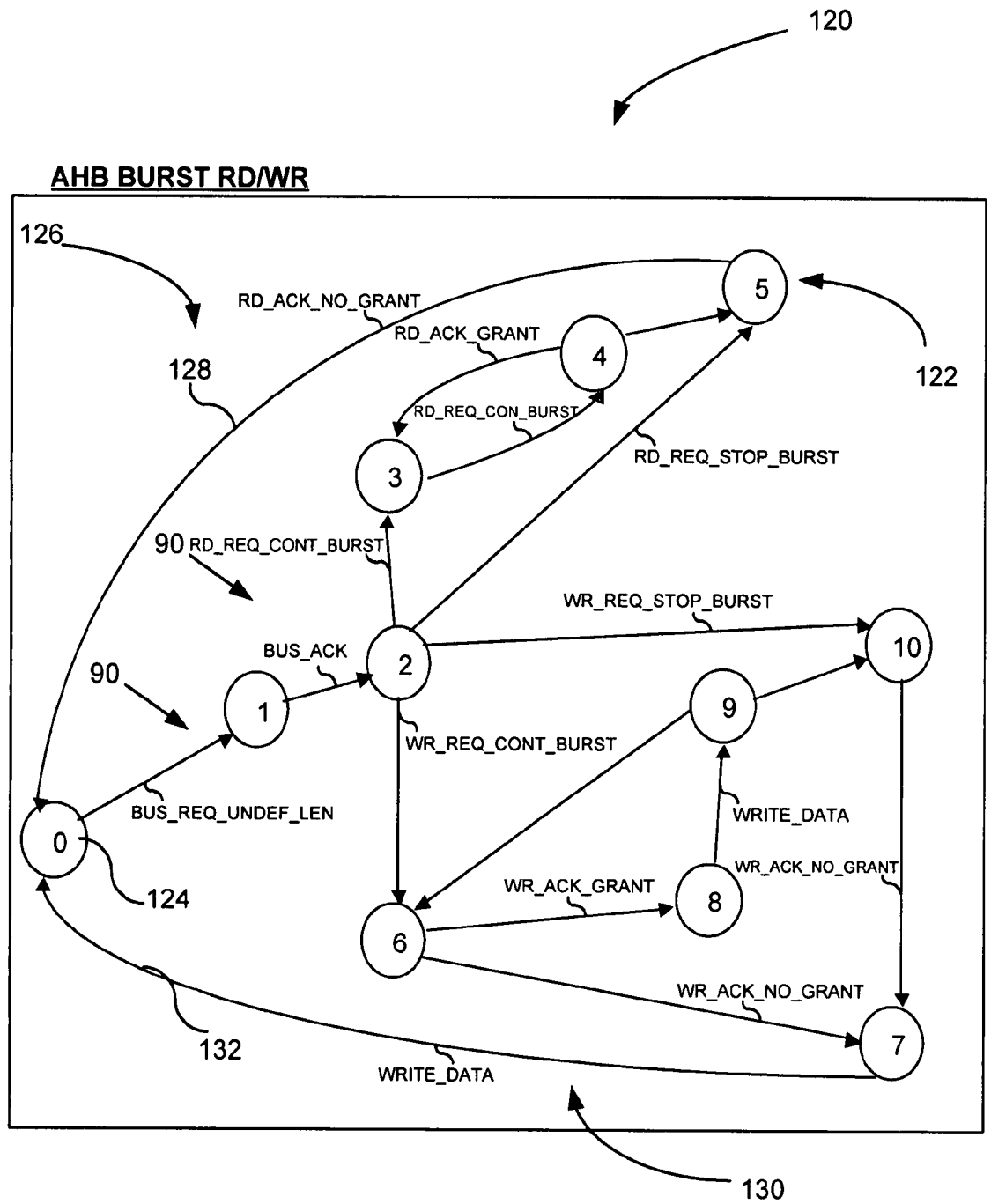
FIG. 4 is a detailed example of a state machine for some of the available transactions.
Figure 5:
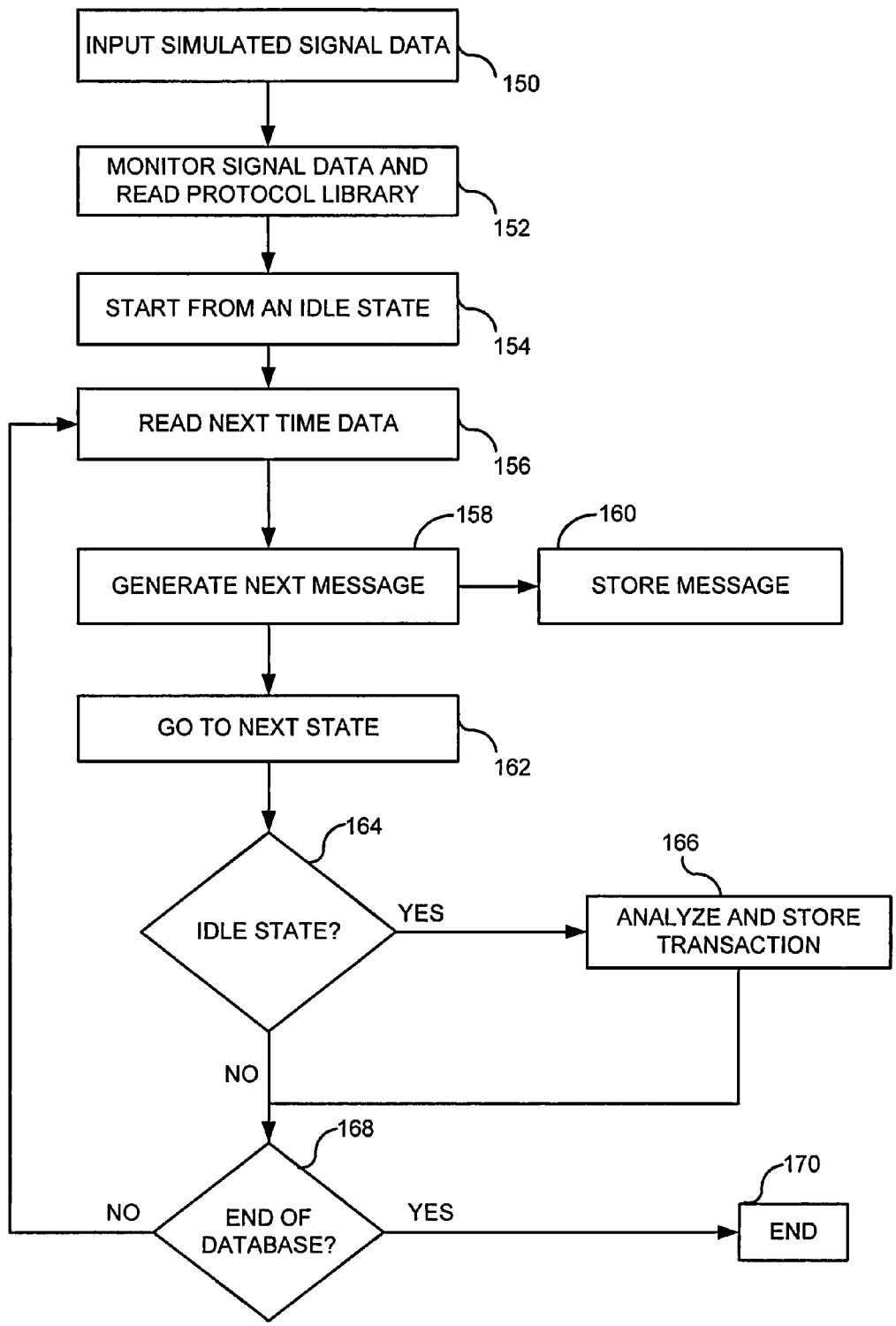
FIG. 5 is a detailed flowchart of a method for converting the simulated circuit description into transactions.

A message recognition module 50 reads the simulation data 48 and analyzes the data to convert it to messages of the protocol stored in the protocol library 44. FIGS. 3-5 describe this conversion more thoroughly, but generally switching signals of the simulation are compared (during various time slices) to messages within the protocol library 44 to determine what message is being processed during a particular time slice. The messages associated with the switching signals during each time slice are then stored to convert the switching signals into messages.

A transaction recognition module 52 reads the messages determined by the message recognition module 50 and converts the messages into transactions using a comparison of a series of messages to predetermined messages within the protocol library 44. If a match is found, then the transaction recognition module stores the series of messages as a transaction. The result is that the messages are converted into a series of transactions.

A transaction sequence recognition module 54 converts multiple transactions into a single super-transaction sequence. For example, several Writes can be converted into a single control operation. This conversion from multiple transactions to a super-transaction sequence is described further below in relation to FIG. 6. If desired, the transaction sequence recognition module 54 may be bypassed or omitted, so that the transactions are output directly. Results 56 of the conversion are output onto a storage medium or a display.

In any event, the simulated circuit description is taken to a higher level of abstraction, as the simulation data is converted first to messages, then to transactions, and finally, if desired, to transaction sequences. The compiler 42, simulator kernel 46, and modules 50, 52, 54, may all be run from on the same computer. Alternatively, the circuit description may be compiled and simulated in a different location so that the resultant simulation data 48 is merely on a storage medium to be input into the message recognition module 50. In such a case, as shown at 58, it is desirable that the some of the protocol data from the protocol library 44 is incorporated into the simulation data in a pre-processing step.

FIG. 3 shows a detailed example of part of the simulated signal data 48. Various signal data 70 on hardware lines are shown including a clock line 72, a read/write line 74, a bus request line 76, a ready line 78, address lines 80, and data lines 82. Simulation is also carried out on many more hardware lines, which are not shown for convenience. The signals being simulated follow a predetermined protocol 84. A protocol is a set of rules or standards designed to enable circuit elements to communicate together and exchange information with as little error as possible. The protocol 84 is made up of a plurality of transactions 85, such as shown at 86 (i.e., transaction A) and at 88 (i.e., transaction B). A transaction is a discrete activity, such as a Read or Write operation that moves data from one place to another in the system. Other example transactions include Control or Setup transactions. The transactions 86, 88 are in turn made up of a series of messages 90. For example, transaction 86 is shown as including three messages, 92, 94, and 96. A message is a smaller unit of information electronically transmitted from one circuit element to another to facilitate the transaction. Example messages include "request for bus", "acknowledge", "ready", etc. Those skilled in the art will readily recognize that these are only examples of transactions and messages and others may be used. Each message is associated with a time-slice 98, such as those shown at 100, 102, and 104. Normally, the time-slices are based on the clock signal 72. During each time-slice, the hardware lines 70 are analyzed to determine the message being sent in correspondence with the transactions of the protocol, as further described below. Transaction 88 is similar to transaction 86 and need not be further described.

FIG. 4 shows an example part of a state machine 120 stored within the protocol library 44. Different states 122 are shown as numbered circles. Messages, such as those at 90, are shown in boxes, and cause the state machine to move from one state to another. Transactions may be defined by a path through the state machine 120 that starts at an idle state 124 (state 0) and that ends at the same idle state, although those skilled in the art will recognize that the state machine 120 may be constructed in a variety of different formats. For example, a read transaction 126 is made up of numbered states 0, 1, 2, 3, 4 and 5. The read transaction 126 is completed upon return to the idle state from state 5 to state 0, as shown by arrow 128. A write transaction 130 is made up of numbered states 0, 1, 2, 6, 7, 8, 9, and 10. The write transaction 130 is completed upon return to the idle state from state 7 to state 0, as shown by arrow 132.

FIG. 5 shows a flowchart of a method preformed by the message recognition module 50 and the transaction recognition module 52 in order to convert the simulation data into a transaction-based description. At process box 150, the simulated input data (see box 48 in FIG. 2) is received so that it may be used by the message recognition module 50. Such simulation data is normally within a database. In process box 152, the analysis starts by monitoring the signal data 70 on the various hardware lines upon which messages are received. Additionally, in process box 152, the protocol library 44 is read to access a state machine, such as state machine 120, associated with the protocol. In process box 154, in order to analyze a transaction, an assumption is made that the transaction starts from the idle state 124. In process box 156, a time-slice of data is read corresponding to the clock signal on hardware line 72. For example, in FIG. 3, the data may be read starting with a time-slice 100. Thus, the switching signals on the various hardware lines are read in order to be analyzed. In process box 158, the data read is analyzed by comparing the switching signals to known patterns of messages stored in the protocol library 44. Returning briefly to FIG. 4, from the idle state 124, a bus request message changes the state of the state machine to state 1. A bus request message has a particular pattern of signal data on the hardware lines, which is compared to a known pattern in the protocol library 44. Thus, once a match is found between the known pattern of messages and the message analyzed during the currently analyzed time-slice, the message has been determined and is stored in process box 160. In process box 162, the current state of the state machine is updated to reflect the change of state. Continuing with the example, the new state is state 1 after a bus request message is received. In decision box 164, a determination is made whether the state machine has returned to the idle state. If yes, this indicates that a transaction is complete and the transaction is determined in process box 166 by comparing a sequence of the stored messages to a sequence of known messages in the protocol library 44. The sequence of stored messages are those received from the start of the idle state until the state machine returned to the idle state. Once a match is found between the sequence of stored messages and those in the protocol library, the transaction associated with those messages is easily obtained from the protocol library 44. The determined transaction is then stored as indicated in process box 166. In decision box 168, a check is made whether all of the input simulated signal data has been analyzed by reading whether the database including the signal data is at the end. If yes, the method ends as shown at 170. Otherwise, the method continues at process box 156 and the next time-slice is read (e.g., time-slice 102). Once the method ends, the database of signal data is converted into a series of transactions associated with the protocol found in the protocol database 44.

Figure 6:
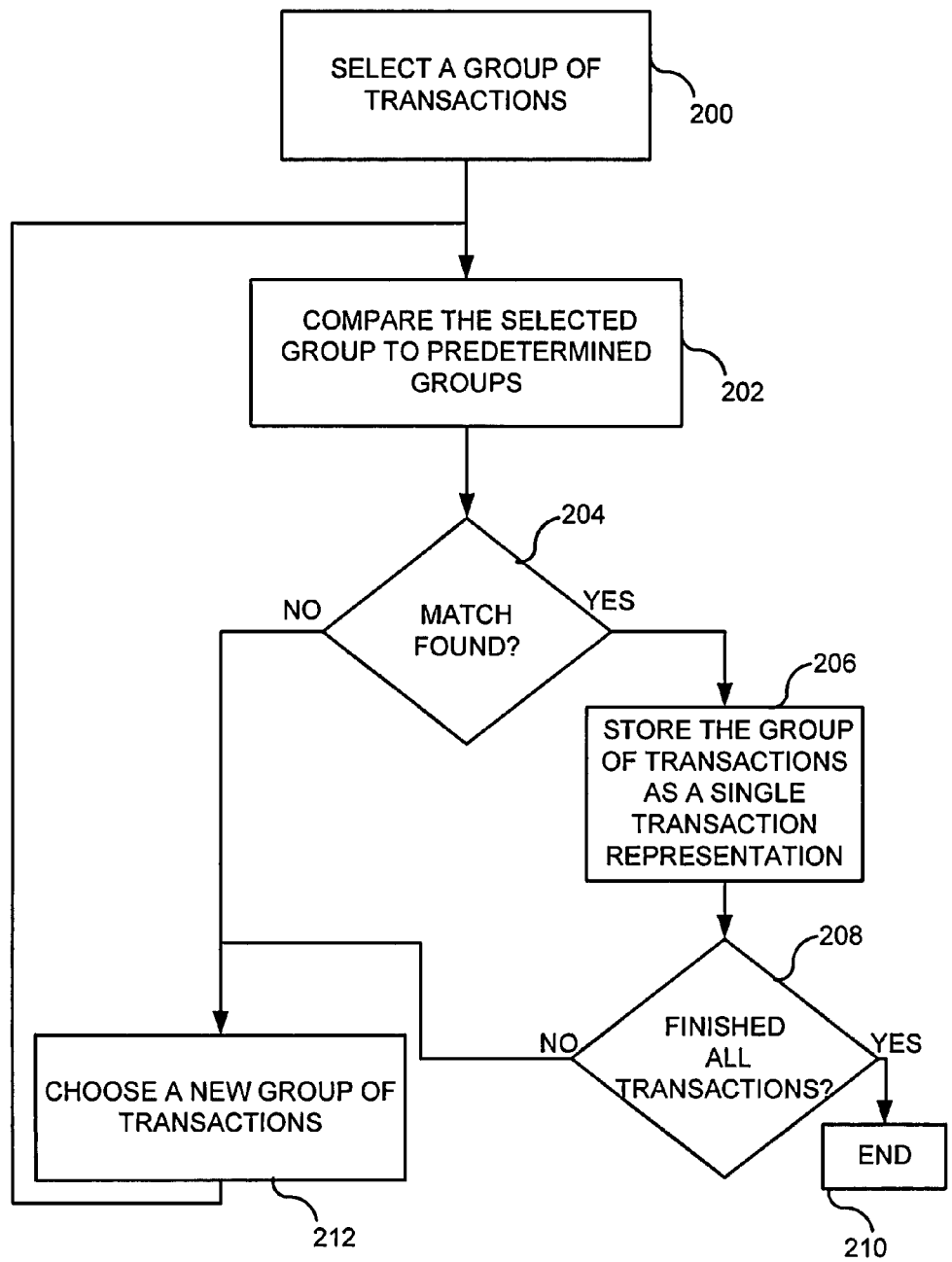
FIG. 6 is a flowchart of a method for converting a series of transactions into a super-transaction representation.

FIG. 6 shows a method implemented by the transaction sequence recognition module 54 (see FIG. 2). It may be desirable to group transactions together in order to display to a user the circuit at an even higher level of abstraction. For example, several write/read transactions can be shown as a single control transaction as opposed to individual transactions. In process box 200, a group of transactions is selected. For example, if there are many of the same type of transactions in sequence (e.g., Reads), such a sequence may be condensed. In process box 202, the selected group is compared to predetermined groups. In decision box 204, a determination is made whether there is a match between the selected group and the predetermined groups. If there is a match, then in process box 206, the sequence of transactions is stored as a single transaction in order to convert the circuit description to an even higher level of abstraction. In decision box 208, a check is made whether all of the transactions have been read. If yes, then the method ends at 210. If not, then a new group of transactions is chosen at 212, and the process starts over at process box 202.

FIG. 7 shows an example of a display showing the simulation data of FIG. 3 at a higher level of abstraction. Particularly, instead of signals, the simulation data is shown as a series of transactions. Write transactions, such as at 240, are shown as dotted lines and read transactions, such as shown at 242, are shown as solid lines. Throughput is shown along the Y-axis and time is indicated along the X-axis. Thicker lines generally mean there is a grouping of many transactions so close in time that at the current zoom level they cannot be distinguished. Of course, a zoom option may be used to focus on particular transactions, as well as monitoring the transaction parameters (such as Address and Data) As can readily be seen, the view of FIG. 7 is much easier to read than that of FIG. 3 and allows the designer to obtain a better overall system view of the flow of data.

FIG. 8 shows that portions of the system 38 may be applied to a distributed network, such as the Internet. Of course, the system 38 also may be implemented without a network (e.g., a single computer). A server computer 260 may have an associated database 262 (internal or external to the server computer). The server computer is coupled to a network shown generally at 264. One or more client computers, such as those shown at 268 and 270, are coupled to the network to interface with the server computer using a network protocol.

FIG. 9 shows a flow diagram using the network of FIG. 8. In process box 300, the circuit description to be transformed is sent from a client computer, such as 268, to the server computer 260. In process box 302, the circuit description is simulated. In process box 304, the circuit description is converted into a series of transactions as already described. In process box 306, the results of the simulation are sent though the network to the client computer 268. Finally, in process box 308, the results are displayed to the user. It should be recognized that the simulation process block 302 may also be preformed on the client side and the results of the simulation sent to the server for conversion.

Having illustrated and described the principles of the illustrated embodiments, it will be apparent to those skilled in the art that the embodiments can be modified in arrangement and detail without departing from such principles.

In view of the many possible embodiments, it will be recognized that the illustrated embodiments include only examples of the invention and should not be taken as a limitation on the scope of the invention. Rather, the invention is defined by the following claims. We therefore claim as the invention all such embodiments that come within the scope of these claims.

We claim:

1. A computer-implemented method for converting results from a simulation of a description of a circuit into one or more transactions of a protocol, wherein a message of the protocol is a subpart of a transaction of the protocol, the method comprising:

using one or more computers:

receiving a set of simulation data, the set of simulation data corresponding to a time-slice of results from a simulation of a circuit description;

comparing signal values of the set of simulation data to signal values associated with messages of the protocol;

determining a sequence of messages by identifying matches between the set of simulation data and messages of the protocol;

comparing the determined sequence of messages to paths within a state machine corresponding to the protocol, wherein;

the state machine has a plurality of states and transitions between states, and the plurality of transitions corresponds to messages of the protocol;

determining transactions by identifying a path between states of the state machine that corresponds to the determined sequence of messages, wherein the path has a known first state and a known last state;

selecting a group of the determined transactions;

comparing the selected group of determined transactions to predetermined groups of transactions;

determining a match between the selected group of determined transactions and one of the predetermined groups of transactions;

based on the match, converting the selected group of determined transactions into a single sequence of transactions; and storing the sequence of transactions to a memory storage location.

2. The method of claim 1, further including:

compiling the description of the circuit using the protocol library for the compilation;

simulating the design to generate the simulation data.

3. The method of claim 1, wherein reading the simulation data includes using a protocol library to supplement the simulation data.

4. The method of claim 1, wherein the description of the circuit is in a hardware description language.

5. A non-transitory computer-readable medium including computer-executable instructions stored thereon for performing a method, the method comprising:
- receiving a set of simulation data, the set of simulation data corresponding to a time-slice of results from a simulation of a circuit description;
- comparing signal values of the set of simulation data to signal values associated with known messages of a protocol stored in a protocol library;
- determining a sequence of messages by identifying matches between the set of simulation data and messages of the protocol;
- comparing the determined sequence messages to paths within a state machine corresponding to the protocol, wherein;
- the state machine has plurality of states and transitions between states; and
- the plurality of transitions corresponds to messages of the protocol;
- determining transactions by identifying a path between states of the state machine that corresponds to the determined sequence of messages, wherein the path has a known first state and a known last state;
- converting the set of simulation data into the determined transactions;
- selecting a group of the determined transactions;
- comparing the selected group of determined transactions to predetermined groups of transactions;
- determining a match between the selected group of determined transactions and one of the predetermined groups of transactions; and
- based on the match, converting the selected group of determined transactions into a single sequence of transactions.

6. An apparatus comprising:
- a computer programmed with computer-executable instructions for converting a description of a circuit into transactions of a protocol using one or more modules that include:
- a message recognition module configured to:
- compare switching signals, from simulation data, on hardware lines of the circuit during time-slices to known messages of the protocol, wherein multiple messages form a transaction,
- determine a sequence of messages by identifying matches between the switching signals and the known messages, and
- convert the simulation data for each time-slice into the determined messages;
- a transaction recognition module configured to:
- compare the sequence of messages determined by the message recognition module to possible paths between states of a state machine associated with the protocol, wherein;
- the state machine has a plurality of states and transitions between states; and
- the plurality of transitions corresponds to messages of the protocol,
- determine one or more transactions of the protocol by identifying matches between the sequence of determined messages and the possible paths, wherein the path has a known first state and a known last state,
- convert the sequences of the determined messages into the determined transactions; and
- a transaction sequence recognition module configured to convert a plurality of the determined transactions into a single sequence of transactions based on a match between the plurality of determined transactions and a predetermined group of transactions that are be analyzable as a single transaction.

7. The apparatus of claim 6, wherein the computer further includes a compiler to compile the description of the circuit;
- a simulation kernel to simulate the compiled design;
- a protocol library to store messages and transactions of the protocol.

8. The apparatus of claim 6, wherein the description of the circuit is in a hardware description language.

9. The apparatus of claim 6, further including a protocol library that stores the state machine.

10. A non-transitory computer-readable medium including computer-executable instructions stored thereon for performing a method of converting a description of a circuit into transactions, the method comprising:
- recognizing messages from simulation data of the description of the circuit;
- converting the messages into transactions to store the description of the circuit as a series of protocol transactions, wherein the converting comprises starting from a first known state in a state machine description, moving to other states in the state machine description based on the messages, and after returning to the first state of the state machine description, identifying a transaction that occurred based on a path taken through the state machine, the state machine description being indicative of multiple states and multiple paths through the states, at least some of the paths corresponding to the transactions;
- selecting a group of the protocol transactions;
- comparing the selected group of protocol transactions to one or more predetermined groups of transactions;
- determining a match between the selected group of protocol transactions and one or more of the predetermined groups of transactions; and
- based on the match, converting the selected group of protocol transactions into a single control transaction.

11. The computer-readable medium of claim 10, wherein the method further comprises generating the simulation data.

12. The computer-readable medium of claim 10, wherein the method further comprises compiling the description of the circuit.

13. The method of claim 1, wherein the selected group of determined transactions comprises a plurality of read and write transactions and the single sequence of transactions comprises a single control transaction.

14. The method of claim 13, further comprising:
- displaying the single control transaction such that:
  - all of the plurality of read and write transactions are represented concurrently along a time axis in an order in which the transactions occurred; and
  - the read transactions are distinguishable from the write transactions.

15. The method of claim 14, wherein the display shows throughput as a function of time.

16. The non-transitory computer-readable medium of claim 5, wherein the method further comprises:
- displaying the determined transactions such that the determined transactions are represented concurrently along a time axis in an order in which the transactions occurred and such that different types of transactions are distinguishable from one another.

17. The non-transitory computer-readable medium of claim 10, wherein the method further comprises:

displaying a group of the transactions such that the displayed group of transactions are represented concurrently as a series of indicators arrayed along a time axis in an order in which the transactions occurred and such that different types of transactions are visually distinguishable from one another.

\* \* \* \* \*